United States Patent
Lin et al.

(10) Patent No.: US 10,163,895 B2
(45) Date of Patent: Dec. 25, 2018

(54) ELECTROSTATIC DISCHARGE PROTECTION DEVICE

(71) Applicant: United Microelectronics Corp., Hsinchu (TW)

(72) Inventors: Heng-Yu Lin, Kaohsiung (TW); Kuei-Chih Fan, Miaoli County (TW); Hou-Jen Chiu, Taichung (TW); Mei-Ling Chao, Tainan (TW); Tien-Hao Tang, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 134 days.

(21) Appl. No.: 15/365,602

(22) Filed: Nov. 30, 2016

(65) Prior Publication Data
US 2018/0114787 A1    Apr. 26, 2018

(30) Foreign Application Priority Data
Oct. 24, 2016 (TW) .............................. 105134261 A

(51) Int. Cl.
| H01L 27/02 | (2006.01) |
| H01L 29/10 | (2006.01) |
| H01L 29/78 | (2006.01) |
| H01L 29/40 | (2006.01) |

(52) U.S. Cl.
CPC ...... H01L 27/0274 (2013.01); H01L 29/1095 (2013.01); H01L 29/408 (2013.01); H01L 29/7816 (2013.01); H01L 29/7835 (2013.01)

(58) Field of Classification Search
CPC .......................... H01L 27/0274; H01L 23/60
See application file for complete search history.

(56) References Cited

U.S. PATENT DOCUMENTS

| 6,274,911 | B1 | 8/2001 | Lin et al. | |
| 7,372,083 | B2 | 5/2008 | Lee et al. | |
| 2007/0034956 | A1* | 2/2007 | Lee ...................... | H01L 27/0262 257/355 |
| 2016/0260700 | A1 | 9/2016 | Huang et al. | |
| 2017/0063079 | A1* | 3/2017 | Gu ......................... | H02H 9/046 |
| 2017/0309613 | A1* | 10/2017 | Chao ................... | H01L 29/0692 |

\* cited by examiner

*Primary Examiner* — Moazzam Hossain
*Assistant Examiner* — Hajar Kolahdouzan
(74) *Attorney, Agent, or Firm* — J.C. Patents

(57) ABSTRACT

An ESD protection device on a substrate includes a base doped region of a first conductivity type. A first inter doped region of a second conductivity type is in the base doped region. A drain region of the second conductivity type in the first inter doped region is connected to a first electrode terminal. An inserted doped region of the first conductivity type is in the drain region. A second inter doped region of the second conductivity type is in the base doped region. A source region of the second conductivity type is in the second inter doped region. A substrate-surface doped region of the first conductivity type in the substrate is adjacent to or in contact with the source region. A gate structure is between the drain and source regions in the substrate. The substrate-surface doped region and the source region are connected to a second electrode terminal.

23 Claims, 9 Drawing Sheets

ELECTROSTATIC DISCHARGE PROTECTION DEVICE

CROSS-REFERENCE TO RELATED APPLICATION

This application claims the priority benefit of Taiwan application serial no. 105134261, filed on Oct. 24, 2016. The entirety of the above-mentioned patent application is hereby incorporated by reference herein and made a part of this specification.

BACKGROUND

1. Field of the Invention

The invention relates to a semiconductor device. More particularly, the invention relates to an electrostatic discharge (ESD) protection device.

2. Description of Related Art

A semiconductor-based integrated circuit (IC) serves as a part of an electronic device. In practice, electrostatic discharge (ESD) protection is required by the electronic device. When accumulation of static charges reaches to a certain level, the electrical potential difference may lead to ESD. Transient electric current\voltage caused by ESD enters into internal IC and leads to IC damage.

According to industry standards, ESD standards used by IC are 2 kV for Human-Body Model (HBM) and 200V for Machine Model (MM). Thus, an ESD protection device is generally applied in IC design in order to protect a large amount of static electricity generated by electrostatic discharge from entering into the IC and causing damages to internal circuits.

The design of ESD protection devices should comply with both the HBM standard and the MM standard. Therefore, continuous research and development are required by the design of the ESD protection device.

SUMMARY OF THE INVENTION

The invention provides an electrostatic discharge (ESD) protection device that satisfies the required standards of both the Human-Body Model (HBM) and the Machine Model (MM).

According to an embodiment of the invention, an ESD protection device is disposed on a substrate. The ESD protection device includes a base doped region of a first conductivity type in the substrate, a first inter doped region of a second conductivity type within the base doped region, a drain region of the second conductivity type located within the first inter doped region and connected to a first electrode terminal, an inserted doped region of the first conductivity type within the drain region, a second inter doped region of the second conductivity type within the base doped region, a source region of the second conductivity type within the second inter doped region, a substrate-surface doped region of the first conductivity type, and a gate structure disposed on the substrate and between the drain region and the source region. The substrate-surface doped region and the source region are connected to a second electrode terminal, the gate structure is connected to the second electrode terminal or a bias terminal different from the second electrode terminal, and the first conductivity type and the second conductivity type are opposite.

According to an embodiment of the invention, in the ESD protection device, a doped concentration of the inserted doped region and a doped concentration of the substrate-surface doped region are equal or are unequal if photomasks of other electric circuits are used.

According to an embodiment of the invention, in the ESD protection device, a doped concentration of the drain region and a doped concentration of the source region are higher than a doped concentration of the first inter doped region and a doped concentration of the second inter doped region.

According to an embodiment of the invention, in the ESD protection device, the inserted doped region is not connected to the first electrode terminal.

According to an embodiment of the invention, in the ESD protection device, the gate structure is disposed on the substrate and corresponds to an isolation region between the first inter doped region and the second inter doped region.

According to an embodiment of the invention, in the ESD protection device, the substrate-surface doped region is in contact with the base doped region, wherein the base doped region is a high voltage doped well or a doped well.

According to an embodiment of the invention, in the ESD protection device, a doped concentration of the inserted doped region and a doped concentration of the substrate-surface doped region are equal or unequal by if photomasks of other electric circuits are used.

According to an embodiment of the invention, the ESD protection device further includes a plurality of shallow trench isolation units in the substrate, the shallow trench isolation units isolate at least the drain region and the base doped region.

According to an embodiment of the invention, the ESD protection device further includes a plurality of shallow trench isolation units in the substrate, and the shallow trench isolation units isolate an outer side of the drain region and an outer side of the source region.

According to an embodiment of the invention, the ESD protection device includes a substrate of a first conductivity type, an inter doped region of a second conductivity type within the substrate, a drain region of the second conductivity type located within the inter doped region and connected to a first electrode terminal, an inserted doped region of the first conductivity type within the drain region, a doped well of the first conductivity type within the inter doped region, a source region of the second conductivity type within the doped well, a substrate-surface doped region of the first conductivity type within the doped well and adjacent to or in contact with the source region, and a gate structure disposed on the substrate and between the drain region and the source region. The substrate-surface doped region and the source region are connected to a second electrode terminal. The gate structure is connected to the second electrode terminal or is different from a bias terminal of the second electrode terminal. The first conductivity type and the second conductivity type are opposite.

According to an embodiment of the invention, in the ESD protection device, a doped concentration of the inserted doped region and a doped concentration of the substrate-surface doped region are equal or unequal if photomasks of other electric circuits are used.

According to an embodiment of the invention, in the ESD protection device, a doped concentration of the drain region and a doped concentration of the source region are higher than a doped concentration of the inter doped region.

According to an embodiment of the invention, in the ESD protection device, the inserted doped region is not connected to the first electrode terminal.

According to an embodiment, in the ESD protection device, the gate structure is disposed on the substrate and corresponds to an isolation region between the drain region and the doped well.

According to an embodiment of the invention, in the ESD protection device, the substrate-surface doped region is in contact with or isolated from the source region.

According to an embodiment, in the ESD protection device, the inter doped region is a lightly doped region.

According to an embodiment of the invention, the ESD protection device further includes a plurality of shallow trench isolation units in the substrate, and the shallow trench isolation units isolate at least the drain region from and the substrate.

According to an embodiment of the invention, an ESD protection device is disposed on a substrate. The ESD protection device includes a doped well of a first conductivity type in the substrate. An inter doped region of a second conductivity type is within the doped well. A drain region of the second conductivity type is within the inter doped region, and the drain region is connected to a first electrode terminal. An inserted doped region of the first conductivity type is within the drain region. A source region of the second conductivity type is within the doped well. A substrate-surface doped region of the first conductivity type is within the substrate and adjacent to or in contact with the source region. A gate structure is disposed on the substrate and between the drain region and the source region. The source region and the substrate-surface doped region are connected to a second electrode terminal, and the gate structure is connected to the second electrode terminal or is different from a bias terminal of the second electrode terminal. The first conductivity type and the second conductivity type are opposite.

According to an embodiment of the invention, in the ESD protection device, a doped concentration of the inserted doped region and a doped concentration of the substrate-surface doped region can be equal or unequal if photomasks of other electric circuits are used.

According to an embodiment of the invention, in the ESD protection device, a doped concentration of the drain region and a doped concentration of the source region are higher than a doped concentration of the inter doped region.

According to an embodiment of the invention, in the ESD protection device, the inserted doped region is not connected to the first electrode terminal.

According to an embodiment of the invention, in the ESD protection device, the gate structure is disposed on the substrate and corresponds to an isolation region between the inter doped region and the source region.

According to an embodiment of the invention, in the ESD protection device, the substrate-surface doped region is in contact with the doped well.

According to an embodiment of the invention, in the ESD protection device, the inter doped region is a lightly doped region.

According to an embodiment of the invention, the ESD protection device further includes a plurality of shallow trench isolation units in the substrate, and the shallow trench isolation units isolate at least the drain region and the doped well.

Based on what is described above, inserted doped regions are disposed in a drain region by different conductivity types to form a diode device which constitutes additional ESD path to improve the protection ability against ESD of the drain region. Therefore, as provided herein, the required industry standards of ESD protection can be satisfied.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

In an embodiment of the invention, an electrostatic discharge (ESD) protection device in an integrated circuit (IC) is elaborated for a better understanding of factors leading to ESD protection device failure.

Figure 1:
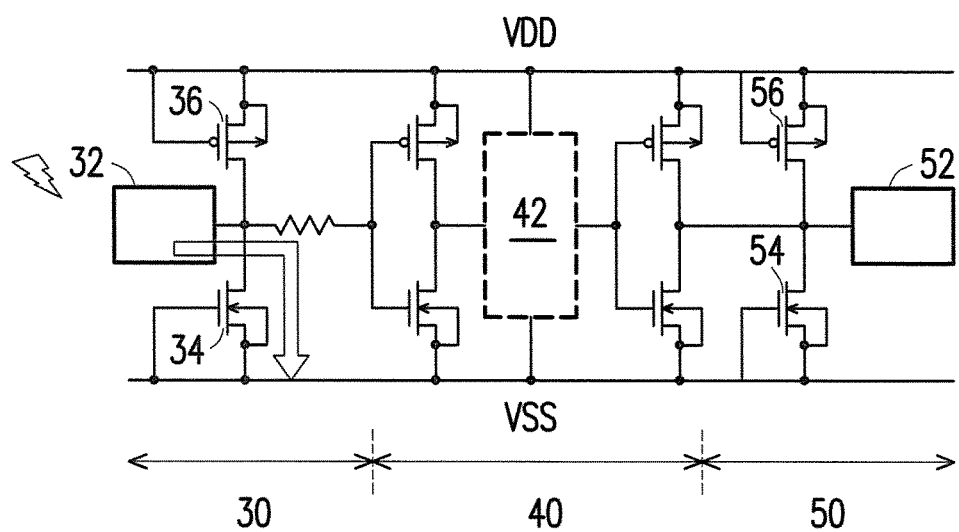
FIG. 1 is a schematic diagram illustrating an integrated circuit including an electrostatic discharge (ESD) protection device according to the invention.

FIG. 1 is a schematic diagram illustrating an integrated circuit including an ESD protection device according to the invention. Referring to FIG. 1, an IC generally includes an ESD protection circuit 30 at an input terminal, an intermediate circuit 40 in the middle, and an ESD protection circuit 50 at an output terminal. The intermediate circuit 40 as a whole also includes an internal circuit 42 performing main functions. At the input terminal, a signal is received by an input end point 32. At the output terminal, a signal is sent by an output end point 52. However, when ESD occurs, a large amount of electric charges generated by ESD also enters into the IC through the input terminal 32 or the output terminal 52. If the electric charges caused by ESD are not properly guided out, the electric charges are likely to enter the intermediate circuit 40 and cause damage. Moreover, if the structure of an ESD device is not properly designed and thus fails to bear an ESD current, damage still occurs. As a result, when the intermediate circuit 40 is not protected by the ESD protection circuits 30 and 50, the intermediate circuit 40 is easily damaged by ESD.

Thus, the ESD protection circuit 30, including an NMOS transistor 34 and a PMOS transistor 36 for example, is connected to the output terminal 32. The ESD protection circuit 50, including an NMOS transistor 54 and a PMOS transistor 56 for example, is connected to the output terminal 52. Therefore, one of the two aforesaid possibilities is taken into consideration. When an ESD current/voltage enters along a path shown by the arrow symbol from the input terminal 32 or the output terminal 52, goes through the NMOS transistor 34 or the NMOS transistor 54, and reaches a system low voltage VSS, the static electric charges are discharged. Similar ESD situation is likely to occur in the PMOS transistor 36 or the PMOS transistor 56.

In the invention, the NMOS transistor 34 is taken for example to elaborate corresponding structures. The structure of the PMOS transistor 36 may be modified in a similar manner according to the structure of the NMOS transistor 34. Several embodiments are provided below to describe the invention; however, the invention is not limited to these embodiments.

Figure 2:
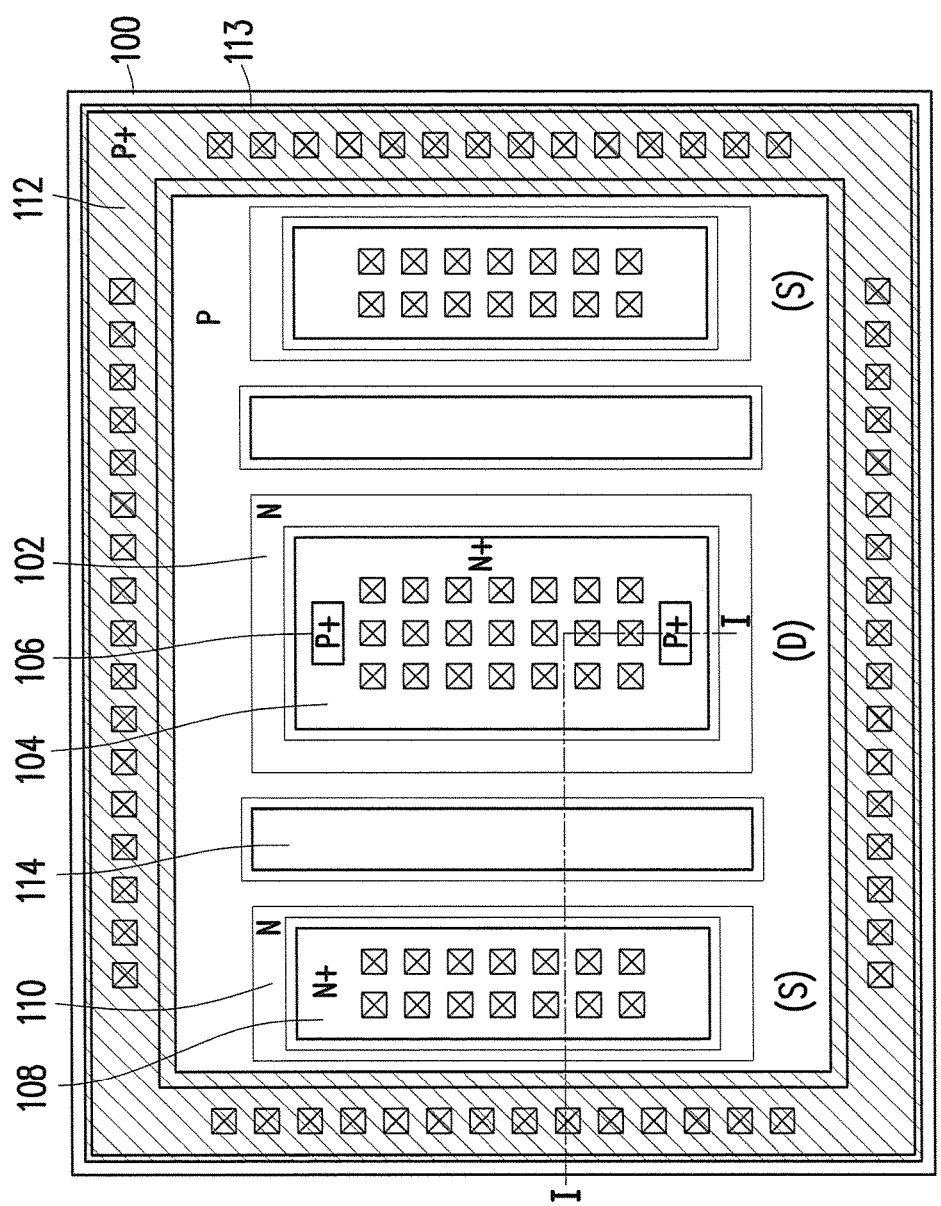
FIG. 2 is a schematic top view of an ESD protection device according to an embodiment of the invention.
Figure 3:
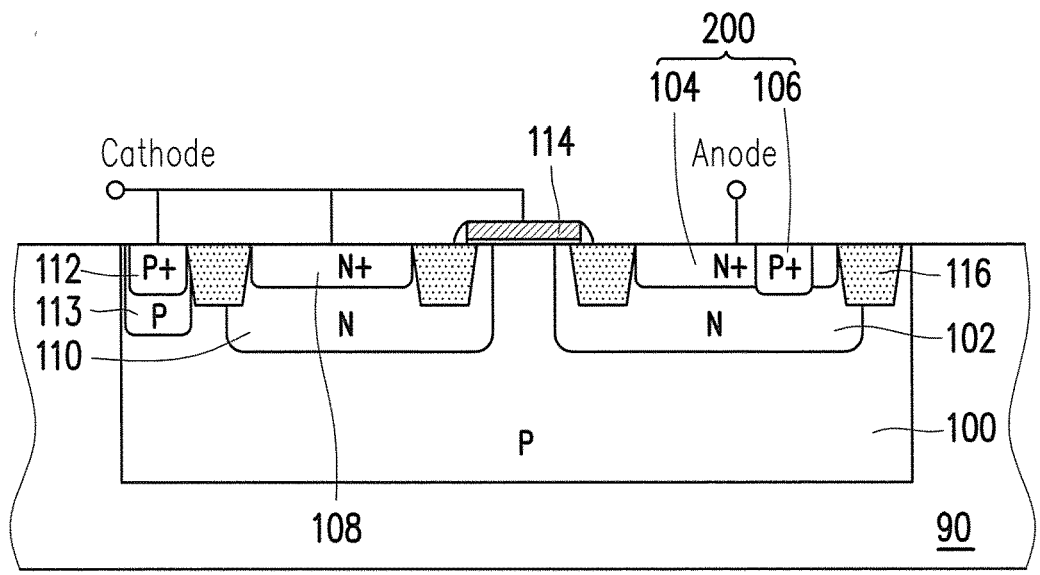
FIG. 3 is a schematic cross-sectional diagram illustrating a structure of an ESD protection device taken along a line I-I depicted in FIG. 2 according to an embodiment of the invention.

FIG. 2 is a schematic top view of an ESD protection device according to an embodiment of the invention. FIG. 3 is a schematic cross-sectional diagram illustrating a structure of an ESD protection device taken along a line I-I depicted in FIG. 2 according to an embodiment of the invention. FIG. 2 and FIG. 3 first describe an ESD protection device according to an embodiment of the invention. An ESD protection device includes a base doped region 100 of a first conductivity type in the substrate 90. According to an embodiment, the ESD protection device includes a base doped region 100, e.g., a high voltage doped well or a general doped well, serves as the base of an MOS device. A first inter doped region 102 of a second conductivity type is within the base doped region 100. A drain region 104 of the second conductivity type is within the first inter doped region 102 and connected to a first electrode terminal.

The first electrode terminal is an anode, for example. An inserted doped region 106 of the first conductivity type is within the drain region 104. Conductivity types of the inserted doped region 106 and the drain region 104 are opposite, so as to constitute a diode device 200 and thereby create another ESD path, contributing to the improvement to the efficiency of the ESD protection device provided in the invention and preventing the ESD protection device from being damaged.

The ESD protection device also includes a second inter doped region 100 of the second conductivity type within the base doped region 100. A source region 108 of the second conductivity type is within the second inter doped region 110. A substrate-surface doped region 112 of the first conductivity type is in the base doped region 110 and adjacent to or in contact with the source region 108. Moreover, in an embodiment, below the substrate-surface doped region 112, i.e., a region between the substrate-surface doped region 112 and the base doped region 100, another doped region 113 can still exist, for example, and the doped region 113 serves to gradually adjust a doped concentration from the substrate-surface doped region 112 to the base doped region 100. As applied in the high voltage device provided in another example, the P-type doped region 113 is also called as a High-Voltage P-type Field (HVPF). The gate structure 114 is disposed on the substrate 90 and between the drain region 104 and the source region 108. The substrate-surface doped region 112 and the source region 108, for example, connect to a second electrode terminal. The second electrode terminal, for example, is a cathode. The gate structure 114 is connected to the cathode or a bias terminal other than the cathode. The gate structure 114 in the embodiment is connected to the cathode as an example. The first conductivity type and the second conductivity type are opposite. The first conductivity type is P-type while the second conductivity type is N-type, for example. Or vice versa, the first conductivity type is N-type while the second conductivity type is P-type, for example.

Specifically speaking, in an ESD protection device as provided in an embodiment, a doped concentration of the inserted doped region 106 and a doped concentration of the substrate-surface doped region are equal or are unequal if photomasks in other circuits are used. In the ESD protection device as provided in an embodiment, a doped concentration of the drain region 104 and a doped concentration of the source region 108 are higher than a doped concentration of the first inter doped region 102 and a doped concentration of the second inter doped region 110. In the ESD protection device as provided in an embodiment, the inserted doped region 106 is not connected to the first electrode terminal, e.g., an anode. Furthermore, the inserted doped region 106 can be extended to and in contact with the first inter doped region 102.

However, the inserted doped region 106 may not be extended to the first inter doped region 102.

In the ESD protection device as provided in an embodiment, the gate structure 114 is disposed on the substrate 90 and corresponds to an isolation region between the first inter doped region 102 and the second inter doped region 110. In the ESD protection device provided in an embodiment, the substrate-surface doped region 112 and the base doped region 100 are high voltage doped wells or doped wells, for example. In the ESD protection device provided in an embodiment, the second inter doped region 110 and the first inter doped region 102 are doped wells or double diffused drain (DDD) wells with doped concentrations.

In the ESD protection device provided in an embodiment, a doped concentration of the inserted doped region 106 and a doped concentration of the substrate-surface doped region 112 are equal. In a semiconductor manufacturing process, the same mask may be used for performing a doping process on the inserted doped region 106 and the substrate-surface region 112 at the same time, for example, so as to save the costs of the doping process performed on the inserted doped region 106; however, the invention is not limited to the process described herein. For example, photomasks of other electric circuits can also be used by the inserted doped region 106 to generate different doped concentrations.

Figure 10:
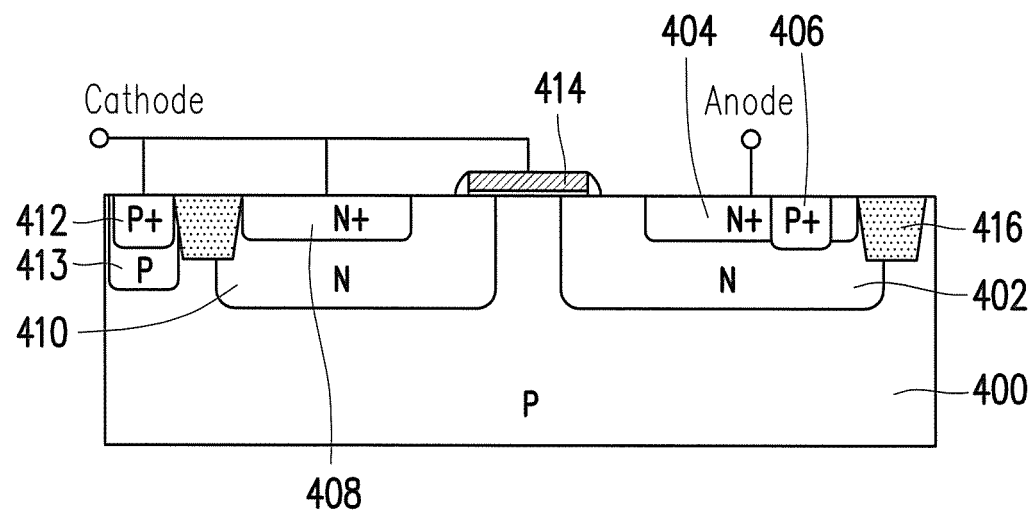
FIG. 10 is a schematic cross-sectional diagram illustrating a structure of an ESD protection device according to an embodiment of the invention.

The ESD protection device provided in an embodiment further includes a plurality of shallow trench isolation units 116 in the substrate 90, and the shallow trench isolation units 116 isolate at least the drain region 114 and the base doped region 100. In practice, the trench isolation units 116 are arranged based on actual needs, and the invention is not limited to the arrangement of the trench isolation units 116 described herein. For example, the shallow trench isolation units 116 in the substrate 90 may isolate the outer side of the drain region 104 and the outer side of the source region 108 as illustrated in FIG. 10 below.

Figure 4:
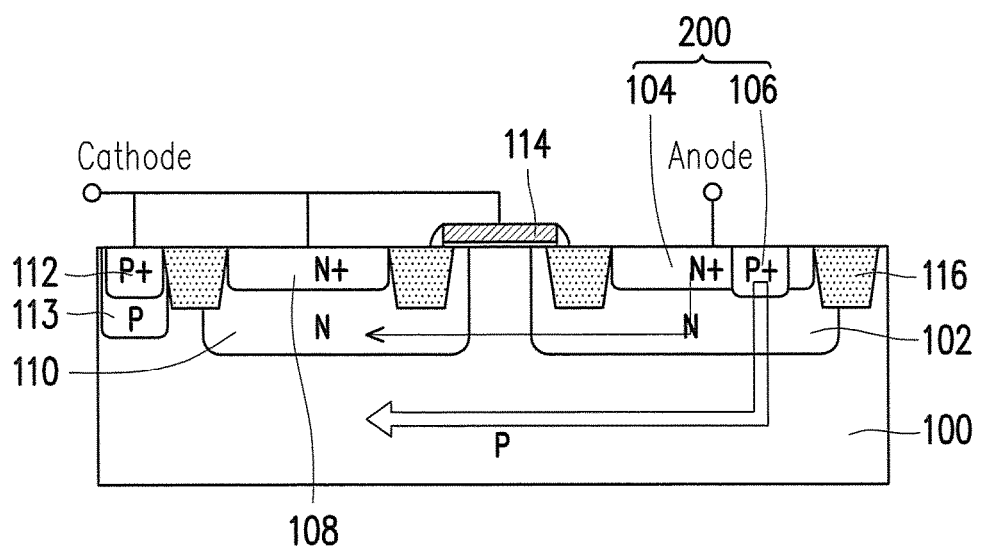
FIG. 4 is a schematic diagram illustrating a discharge mechanism of an ESD protection device according to an embodiment of the invention.

FIG. 4 is a schematic diagram illustrating a discharge mechanism of an ESD protection device according to an embodiment of the invention. Referring to FIG. 4, the following describes the discharge mechanism generated by the ESD protection device provided in the invention. If the arrangement of the inserted doped region 106 is not included in the embodiment, the discharge path of an NPN dual carrier transistor is constituted by the drain region 104 of the ESD protection device through the first inter doped region 102 and the base doped region 100, as the path illustrated by the thin arrow. After research, it is discovered that the ESD current is more likely to be accumulated at the outer sides of the drain region 104 adjacent to the shallow trench isolation units 116, easily causing damages to the transistor capable of performing the ESD protection function.

In an embodiment of the invention, the inserted doped region 106 is disposed in the drain region 104 to form a diode device 200 so as to create another ESD path, as illustrated by the bold arrow symbol, in addition to the ESD path as illustrated by the thin arrow symbol, thus reducing the phenomenon of current concentration in the drain region 104 further strengthening ESD protection efficiency, preventing current concentration in the drain region 104, and reducing the ESD protection device damage. The invention is based on an ESD bypass mechanism generated by the inserted doped region 106, and the mechanism should be known to people having ordinary skill in the art and thus is not described herein in detail. The following describes a plurality of structure changes under the concept; however, the invention is not limited to the embodiments provided herein.

Figure 5:
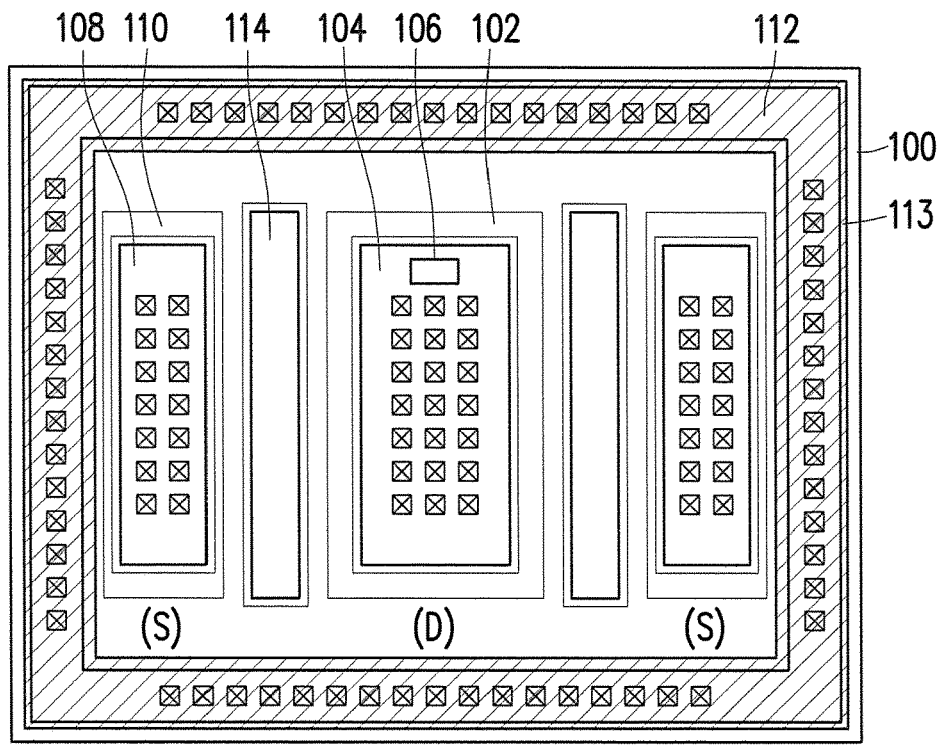
FIG. 5 is a schematic top view of an ESD protection device according to an embodiment of the invention.

FIG. 5 is a schematic top view of an ESD protection device according to an embodiment of the invention. Referring to FIG. 5, as long as the inserted doped region 106 is disposed inside the drain region 104, the inserted doped region 106 does not depart from the scope of protection provided herein. The symbol in FIG. 5 indicates contact pads. The inserted doped region 106 can be disposed around the contact pads. Different from FIG. 2 which illustrates two inserted doped regions 106, FIG. 5 illustrates one inserted doped region 106. Therefore, the number of the inserted doped region 106 is not limited to one or two. In case of one inserted doped region 106, for example, the inserted doped region 106 is disposed inside the drain region 104 and situated at the upper sides of the contact pads.

Figure 6:
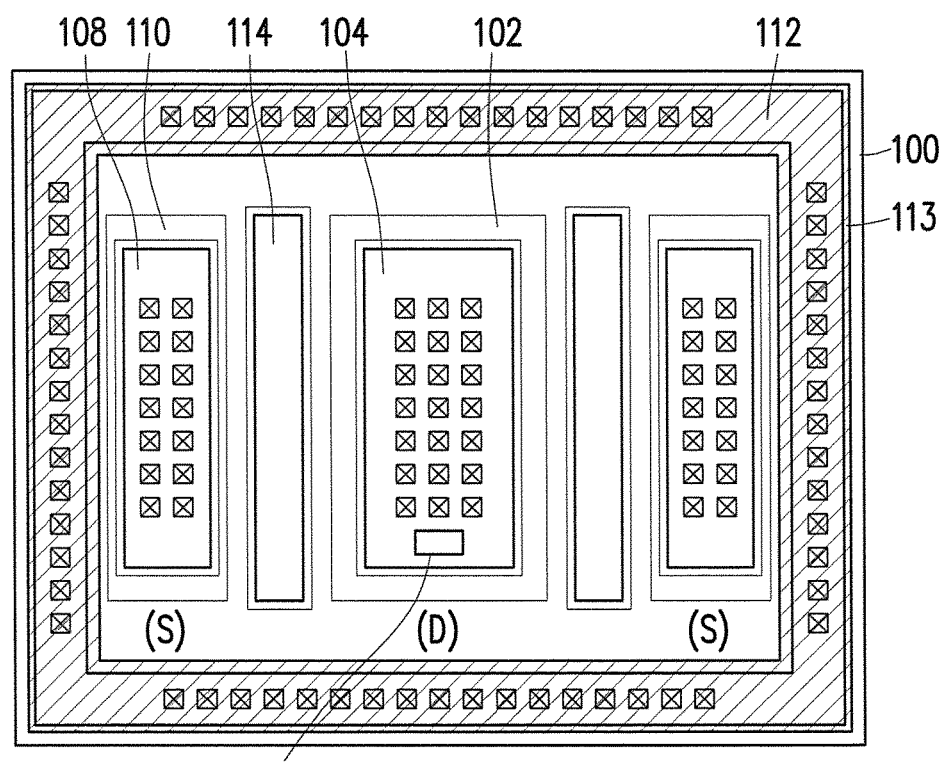
FIG. 6 is a schematic top view of an ESD protection device according to an embodiment of the invention.

FIG. 6 is a schematic top view of an ESD protection device according to an embodiment of the invention. Referring to FIG. 6, the inserted doped region 106 similar to that depicted in FIG. 5 can also be disposed inside the drain region 104 and situated at the lower sides of the contact pads.

Figure 7:
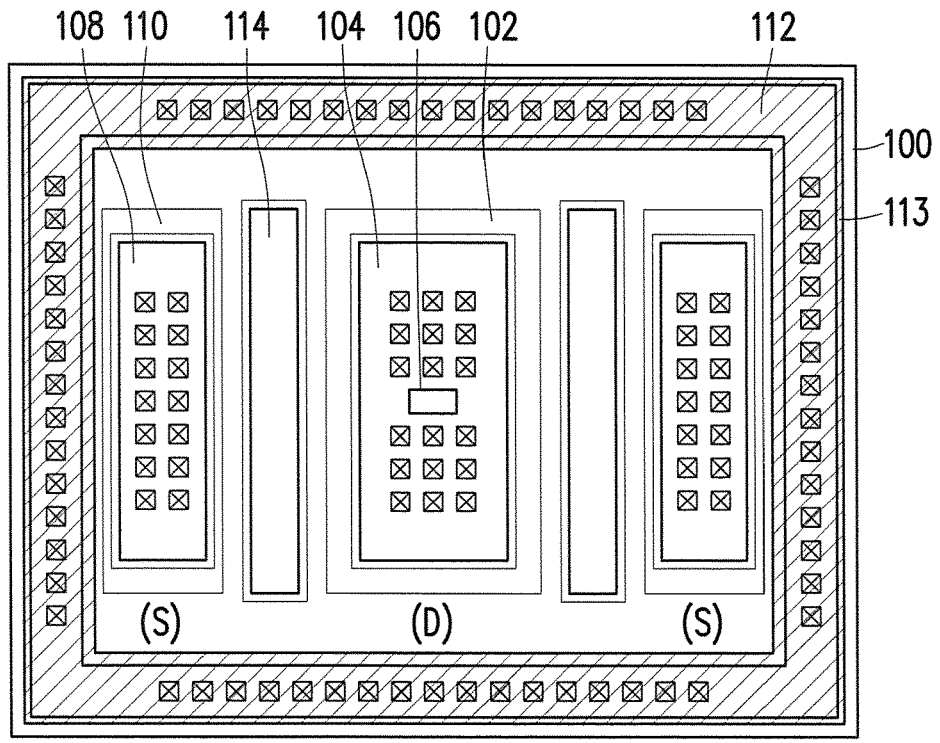
FIG. 7 is a schematic top view of an ESD protection device according to an embodiment of the invention.

FIG. 7 is a schematic top view of an ESD protection device according to an embodiment of the invention. Referring to FIG. 7, the inserted doped region 106 can also be disposed between the contact pads if there is one inserted doped region 106. As the contact pads are generally arranged in array, the inserted doped region 106 is disposed in the middle of the contact pad array, for example.

Figure 8:
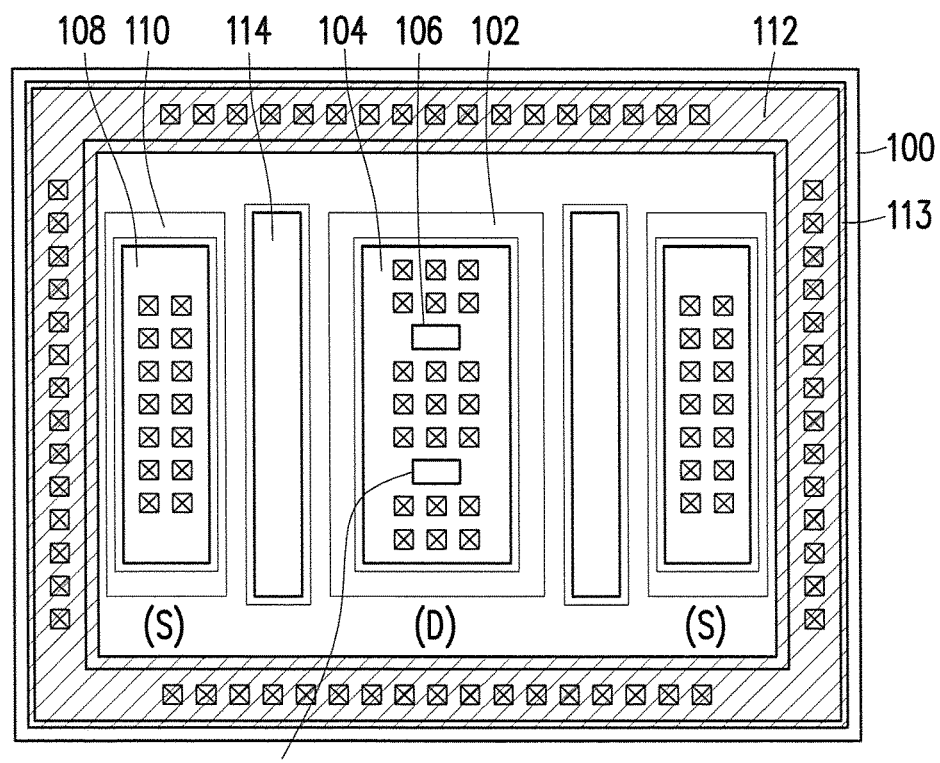
FIG. 8 is a schematic top view of an ESD protection device according to an embodiment of the invention.

FIG. 8 is a schematic top view of an ESD protection device according to an embodiment of the invention. Referring to FIG. 8, if a plurality of inserted doped regions 106 is to be disposed, e.g., two inserted doped regions 106, the inserted doped regions 106 can also be disposed in the contact pad array in comparison with the inserted doped region 106 shown in FIG. 5.

In other words, the number and location of the inserted doped region 106 can be adjusted based on actual design and not limited to the embodiments provided herein.

Figure 9:
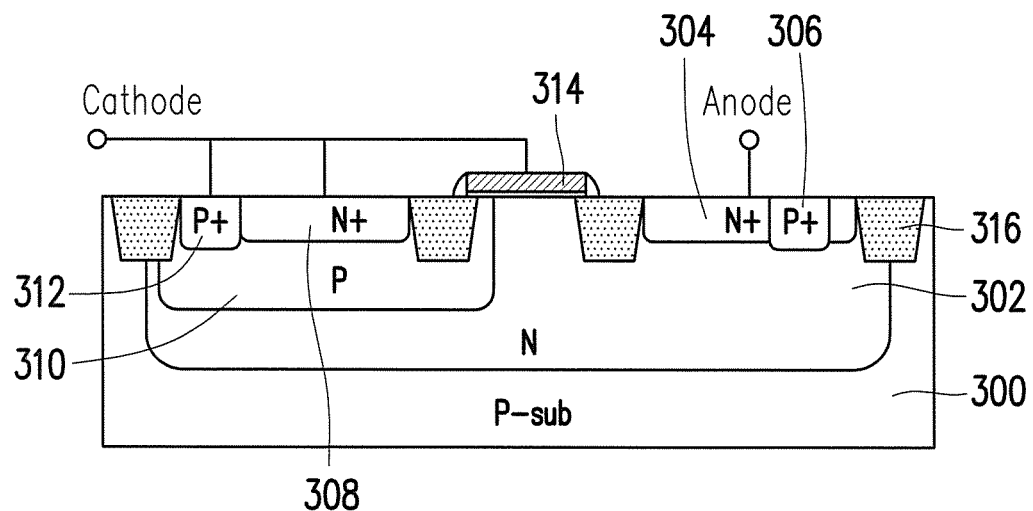
FIG. 9 is a schematic cross-sectional diagram illustrating a structure of an ESD protection device according to an embodiment of the invention.

The following describes different structure changes to an ESD protection device. FIG. 9 is a schematic cross-sectional diagram illustrating a structure of an ESD protection device according to an embodiment of the invention. Referring to FIG. 9, the ESD protection device in the embodiment has a lateral diffused (LD) NMOS structure, for example. The ESD protection device with the LDNMOS structure is designed to have the substrate as the base doped structure.

The following further describes the ESD protection device in the embodiment in detail, wherein a substrate (p-sub) 300 of a first conductivity type is included. An inter doped region 302 of a second conductivity type is in the substrate 300. A drain region 304 of the second conductivity type is within the inter doped region 302, and the drain region 304 is connected to a first electrode terminal, e.g., an anode. An inserted doped region 306 of the first conductivity type is within the drain region 304. A doped well 310 of the first conductivity type is within the inter doped region 302. A source region 308 of the second conductivity type is within the doped well 310. A substrate-surface doped region 312 of the first conductivity type is within the doped well 310 and adjacent to or in contact with the source region 308. The gate structure 314 is disposed on the substrate 300 and between the drain region 304 and the source region 308. The substrate-surface region 312 and the source region 308 are connected to the second electrode terminal, e.g., a cathode. The gate structure 314 is connected to the second electrode terminal or a bias terminal other than the second electrode terminal. The first conductivity type and the second conductivity type are opposite. The ESD protection device as provided in the embodiment also includes a plurality of shallow trench isolation units 316 in the substrate 300, and the shallow trench isolation units 316 isolate at least the drain region 304 and the substrate 300. In practice, the trench isolation units 316 is arranged based on actual needs, and the invention is not limited to the arrangement of the trench isolation units 316 provided herein. For example, the shallow trench isolation units 316 are disposed in the substrate 300 and isolate the outer side of the drain region 304, for example. Moreover, the substrate-surface region 312 in the embodiment, for example, is adjacent to and in contact with the source region 308, and as a result, parts of the shallow trench isolation units 316 are disposed on the outer sides of the source region 308 and the substrate-surface region 312.

FIG. 10 is a schematic cross-sectional diagram illustrating a structure of an ESD protection device according to an embodiment of the invention. Referring to FIG. 10, the ESD protection device in the embodiment is based on the structure in FIG. 3, but the doped concentration of the doped region is adjusted in the present embodiment, so that the ESD protection device is not used in high voltage operation.

The ESD protection device provided herein includes a base doped region 400 of a first conductivity type in the substrate. In the present embodiment, the base doped region 400 serves as a base of a MOS device. A first inter doped region 402 of a second conductivity type is within the base doped region 400. A high voltage doped well required in high voltage operation is not required in the first inter doped region 402 in the embodiment. A drain region 404 of the second conductivity type is within the first inter doped region 402, and the drain region 404 is connected to a first electrode terminal. The first electrode terminal is an anode, for example. An inserted doped region 406 of the first conductivity type is within the drain region 404. Therefore, conductivity types of the inserted doped region 406 and the drain region 404 are opposite, so as to constitute a diode device and thereby create another ESD path, contributing to the improvement to the efficiency of the ESD protection device provided in the invention and preventing the ESD protection device from being damaged.

The ESD protection device also includes a second inter doped region 410 of the second conductivity type in the base doped region 400. A source region 408 of the second conductivity type is within the second inter doped region 410. A substrate-surface doped region 412 of a first conductivity type is disposed in the base doped region 400 in the substrate, and the substrate-surface doped region 412 is adjacent to or in contact with the source region 408. Moreover in an embodiment, below the substrate-surface region 412, i.e., a region between the substrate-surface doped region 412 and the base doped region 400, another doped region 413 can still exist, for example, and the doped region 413 serves to gradually adjust a doped concentration from the substrate-surface doped region 412 to the base doped region 400. The gate structure 414 is disposed on the base doped region 400 within the substrate and between the drain region 404 and the source region 408. The substrate-surface region 412 and the source region 408, for example, are connected to a second electrode terminal. The second electrode terminal, for example, is a cathode. The gate structure 414 may be connected to the cathode or a bias terminal other than the cathode.

In the embodiment, the first inter doped region 402 and the second inter doped region 410 may be shallow doped regions, and the doping level under high voltage operation is not required. Moreover, the locations of the shallow trench isolation units 416 are decided according to actual requirement. The shallow trench isolation units 416 in the embodiment are disposed around the drain region 404 and the source region 408, for example, and no shallow trench isolation unit 416 is disposed within the drain region 404 and the source region 408.

Figure 11:
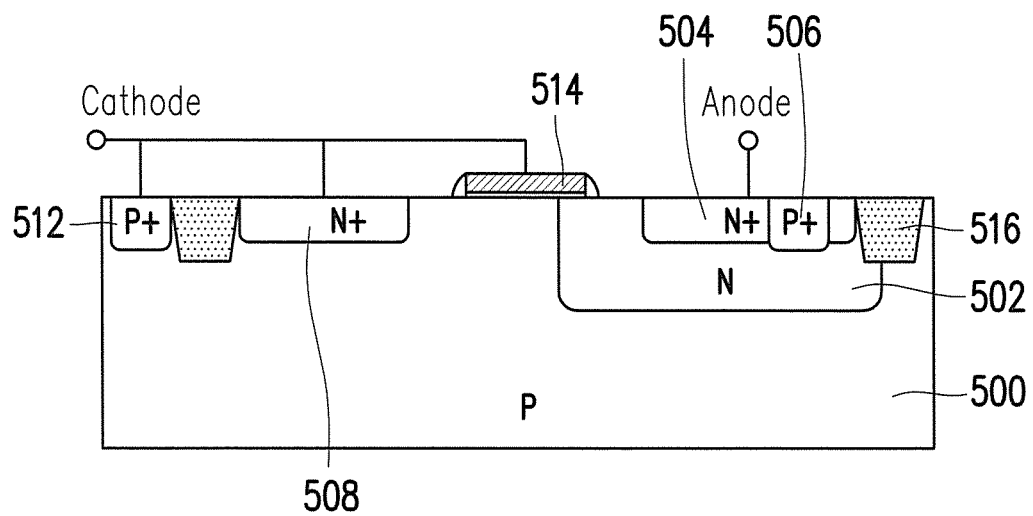
FIG. 11 is a schematic cross-sectional diagram illustrating a structure of an ESD protection device according to an embodiment of the invention.

FIG. 11 is a schematic cross-sectional diagram illustrating a structure of an ESD protection device according to an embodiment of the invention. Referring to FIG. 11, the ESD protection device in the embodiment is a drain-extended (DE) NMOS device, for example, while the invention is not limited to the embodiment provided herein. The ESD protection device in the embodiment is based on a doped well 500 in a substrate. The doped well 500 of the first conductivity type is a doped region, and a plurality of doped structures is formed in the doped well 500, as described below.

The ESD protection device includes a doped well 500 of the first conductivity type in the substrate. An inter doped region 502 of the second conductivity type is disposed in the doped well 500. A drain region 504 of the second conductivity type is disposed in the inter doped region 502 and connected to a first electrode terminal. The first electrode terminal is an anode, for example. An inserted doped region 506 of the first conductivity type is within the drain region 504. A source region 508 of the second conductivity type is within the doped well 500. A substrate-surface doped region 512 of the first conductivity type is disposed in the doped well 500 and adjacent to or in contact with the source region 508. The gate structure 514 is disposed on the substrate and between the drain region 504 and the source region 508. The source region 508 and the substrate-surface doped region 512 are connected to a second electrode terminal, e.g., a cathode. The gate structure 514 may be connected to the second electrode terminal or a bias terminal other than the second electrode terminal. The first conductivity type and the second conductivity type are opposite. For example, the first conductive type is P type, while the second conductive type is N type.

The inter doped region 502 may have the lightly doped concentration and may include a DENMOS device, for example. However, the invention is not limited to the embodiment provided herein.

Moreover, the location of the shallow trench isolation units 516 is determined according to actual requirements. The shallow trench isolation units 516 in the embodiment are disposed at the outer sides of the drain region 504 and the source region 508, for example, while no shallow trench isolation unit 516 is disposed at the inner side of the drain region 504 and the source region 508. Furthermore, the shallow trench isolation units 516 can also be used to isolate the substrate-surface doped region 512 from the source region 508.

Figure 12:
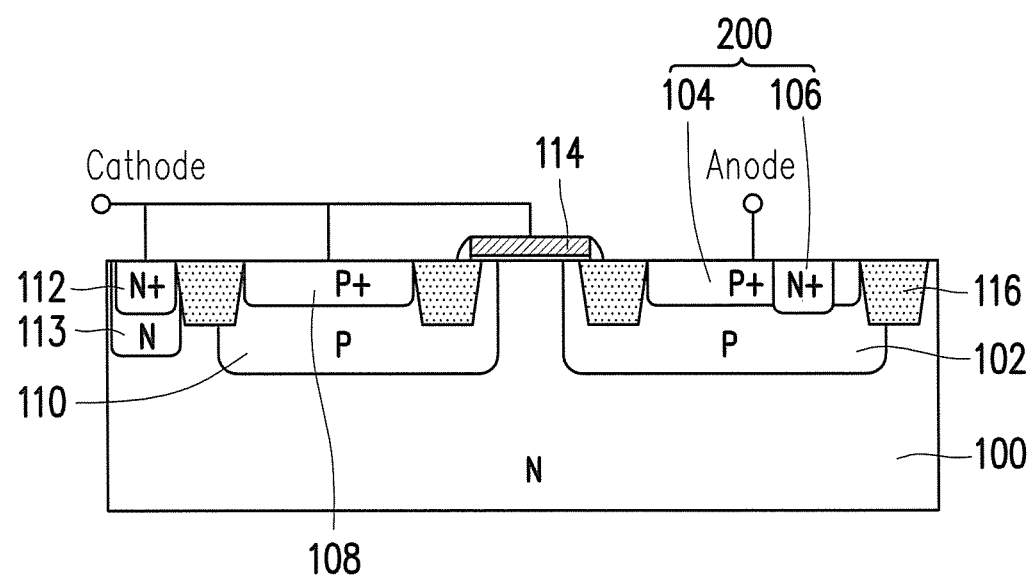
FIG. 12 is a schematic cross-sectional diagram illustrating a structure of an ESD protection device according to an embodiment of the invention.

FIG. 12 is a schematic cross-sectional diagram illustrating a structure of an ESD protection device according to an embodiment of the invention. Referring to FIG. 12, the ESD protection device provided in the invention may also be applied in a device with the PMOS structure. In an embodiment, the ESD protection device depicted in FIG. 12 and the ESD protection device depicted in FIG. 3 share the same doped structure, but the conductivity types of the doped regions of the two devices are opposite. In other words, if the first conductivity type provided the embodiment is an N conductivity type, for example, and the second conductivity type and the first conductivity type are opposite, the second conductivity type is a P conductivity type. The doped structure provided in the present embodiment is depicted in FIG. 3 and is not further described here.

Figure 13:
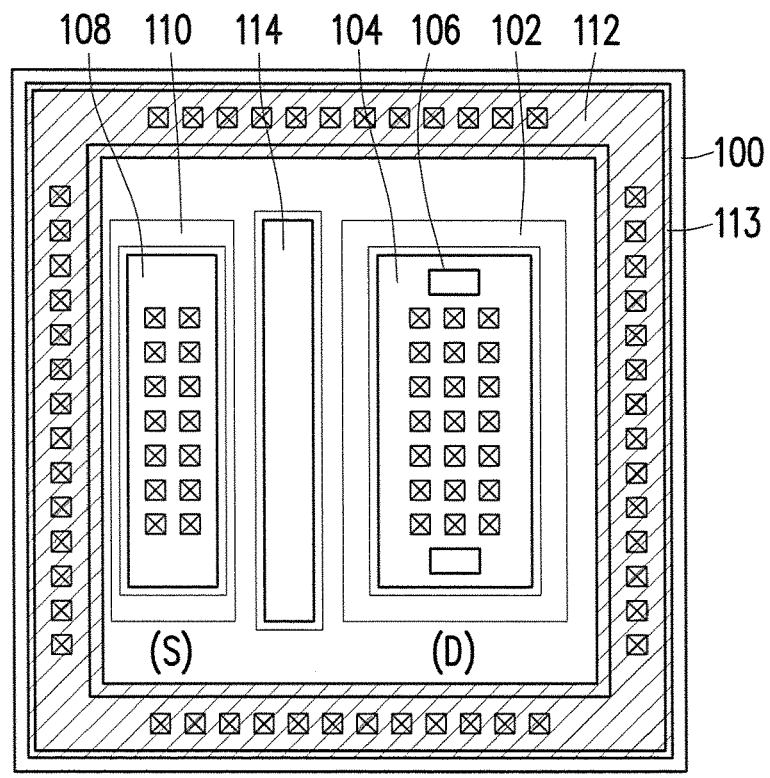
FIG. 13 is a schematic top view of an ESD protection device according to an embodiment of the invention.

Furthermore, the structural layout is not limited to the embodiment depicted in FIG. 2. FIG. 13 is a schematic top view of an ESD protection device according to an embodiment of the invention. Comparing to the source region 108 in FIG. 2, the source region 108 described in the embodiment and depicted in FIG. 13 is disposed in one side of the drain region 104, for example.

Figure 14:
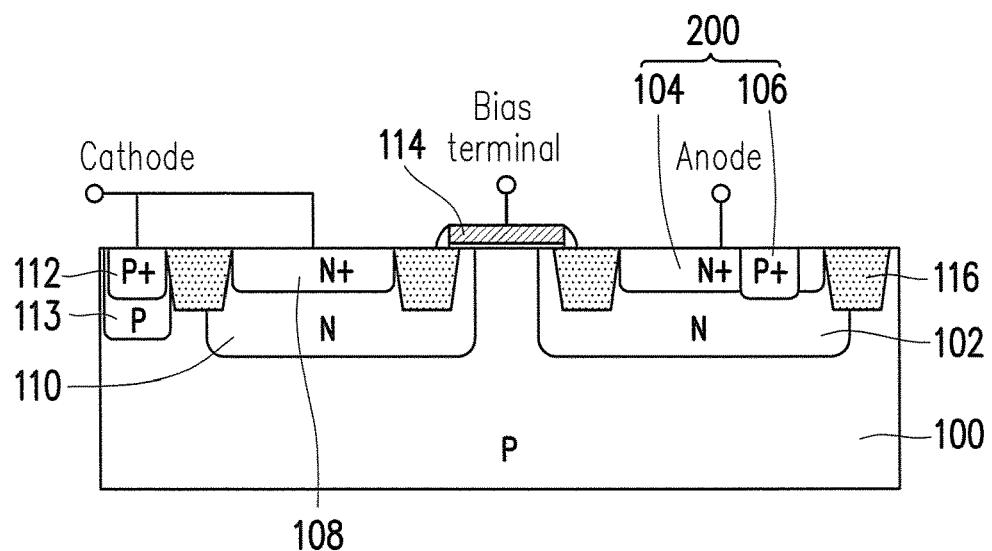
FIG. 14 is a schematic cross-sectional diagram illustrating a structure of an ESD protection device according to an embodiment of the invention.

FIG. 14 is a schematic cross-sectional diagram illustrating a structure of an ESD protection device according to an embodiment of the invention. Referring to FIG. 14, the structure illustrated in FIG. 3 is applied in the embodiment to illustrate how the gate structure 114 is connected. The aforementioned gate structure 114 does not have to be connected to a second electrode terminal, e.g., a cathode, but the gate structure 114 may be connected to another bias terminal.

Figure 15:
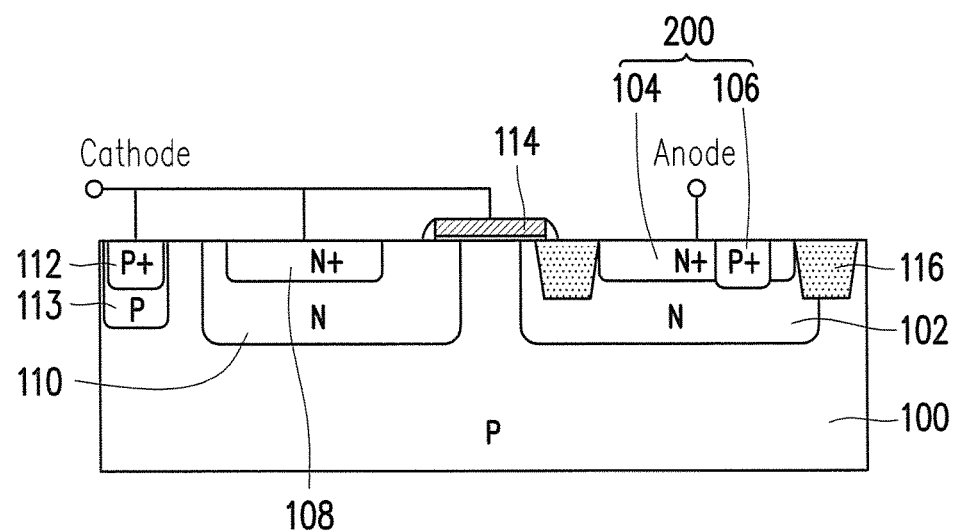
FIG. 15 is a schematic cross-sectional diagram illustrating a structure of an ESD protection device according to an embodiment of the invention.

FIG. 15 is a schematic cross-sectional diagram illustrating a structure of an ESD protection device according to an embodiment of the invention. In the present embodiment shown in FIG. 15, the structure of FIG. 3 is applied to describe one of the changes to the arrangement of the shallow trench isolation units. Comparing to the shallow trench isolation units depicted in FIG. 3, the number and locations of the shallow trench isolation units in the embodiment can be changed. Isolation provided by the shallow trench isolation units 116 may not be required by the source region 108 in the embodiment. In other words, the shallow trench isolation units 116 only has to isolate the two sides of the drain region 114, for example.

To sum up, in the embodiments of the invention, the inserted doped regions of different conductivity types are arranged in the drain region, so as to form a diode device and create another ESD path, thus strengthening the ESD protection efficiency in the drain region. Therefore, as provided in the embodiments of the invention, the requirement of industry standards for electrostatic discharge protection can be satisfied.

The ESD protection device not only can be applied in the high voltage operation but also can be applied to other MOS devices with the ESD mechanism, so as to reduce damages to the ESD protection device.

It will be apparent to those skilled in the art that various modifications and variations can be made to the disclosed embodiments without departing from the scope or spirit of the invention. In view of the foregoing, it is intended that the invention covers modifications and variations provided that they fall within the scope of the following claims and their equivalents.

What is claimed is:

1. An ESD protection device, disposed on a substrate and comprising:
   a base doped region of a first conductivity type in the substrate;
   a first inter doped region of a second conductivity type within the base doped region;
   a drain region of the second conductivity type within the first inter doped region; the drain region being connected to a first electrode terminal;
   an inserted doped region of the first conductivity type within the drain region, wherein the inserted doped region is not connected to the first electrode terminal;
   a second inter doped region of the second conductivity type within the base doped region;
   a source region of the second conductivity type within the second inter doped region;
   a substrate-surface doped region of the first conductivity type in the base doped region and adjacent to or in contact with the source region;
   a third doped region of the first conductivity type disposed between the base doped region and the substrate-surface doped region;
   an isolation structure isolating the drain region from at least an outer side of the drain region; and
   a gate structure disposed on the substrate and between the drain region and the source region,
   wherein the substrate-surface doped region and the source region are connected to a second electrode terminal, the gate structure is connected to the second electrode terminal or a bias terminal different from the second electrode terminal, and
   wherein the first conductivity type and the second conductivity type are opposite.

2. The ESD protection device as claimed in claim 1, wherein a doped concentration of the inserted doped region and a doped concentration of the substrate-surface doped region are equal.

3. The ESD protection device as claimed in claim 1, wherein a doped concentration of the drain region and a doped concentration of the source region are higher than a doped concentration of the first inter doped region and a doped concentration of the second inter doped region.

4. The ESD protection device as claimed in claim 1, wherein the gate structure is disposed on the substrate and corresponds to an isolation region between the first inter doped region and the second inter doped region.

5. The ESD protection device as claimed in claim 1, wherein a doped concentration of the substrate-surfaced doped region is gradually adjusted from the substrate-surface doped region to the base doped region by using the third doped region, and the base doped region is a high voltage doped well or a doped well, wherein the third doped region is in contact with the base doped region.

6. The ESD protection device as claimed in claim 1, wherein a doped concentration of the inserted doped region and a doped concentration of the substrate-surface doped region are unequal.

7. The ESD protection device as claimed in claim 1, wherein the isolation structure comprises a plurality of shallow trench isolation units in the substrate, and the shallow trench isolation units isolate at least the drain region and the base doped region.

8. The ESD protection device as claimed in claim 1, wherein the isolation structure comprises a plurality of shallow trench isolation structures in the substrate, and the shallow trench isolation units isolate the outer side of the drain region and an outer side of the source region.

9. An ESD protection device, comprising:
   a substrate of a first conductivity type;
   an inter doped region of a second conductivity type in the substrate;
   a drain region of the second conductivity type within the inter doped region, the drain region being connected to a first electrode terminal;
   an inserted doped region of the first conductivity type within the drain region, wherein the inserted doped region is not connected to the first electrode terminal;
   a doped well of the first conductivity type within the inter doped region;
   a source region of the second conductivity type within the doped well;
   a substrate-surface doped region of the first conductivity type within the doped well and adjacent to or in contact with the source region; and
   a gate structure disposed on the substrate and between the drain region and the source region,
   wherein the substrate-surface doped region and the source region are connected to a second electrode terminal, the gate structure is connected to the second electrode terminal or is different from a bias terminal of the second electrode terminal, and
   wherein the first conductivity type and the second conductivity type are opposite.

10. The ESD protection device as claimed in claim 9, wherein a doped concentration of the inserted doped region and a doped concentration of the substrate-surface doped region are equal or are unequal.

11. The ESD protection device as claimed in claim 9, wherein a doped concentration of the inserted doped region is higher than a doped concentration of the doped well.

12. The ESD protection device as claimed in claim 9, wherein a doped concentration of the drain region and a doped concentration of the source region are higher than a doped concentration of the inter doped region.

13. The ESD protection device as claimed in claim 9, wherein the gate structure is disposed on the substrate and corresponds to an isolation region between the drain region and the doped well.

14. The ESD protection device as claimed in claim 9, wherein the substrate-surface region is in contact with or isolated from the source region.

15. The ESD protection device as claimed in claim 9, wherein the inter doped region is a lightly doped region.

16. The ESD protection device as claimed in claim 9, further comprising a plurality of shallow trench isolation units in the substrate, the shallow trench isolation units isolating at least the drain region from and the substrate.

17. An ESD protection device, disposed on a substrate and comprising:
- a doped well of a first conductivity type in the substrate;
- an inter doped region of a second conductivity type in the doped well;
- a drain region of the second conductivity type within the inter doped region, the drain region being connected to a first electrode terminal;
- an inserted doped region of the first conductivity type within the drain region, wherein the inserted doped region is not connected to the first electrode terminal;
- a source region of the second conductivity type within the doped well;
- a substrate-surface doped region of the first conductivity type within the doped well and adjacent to or in contact with the source region; and
- a gate structure disposed on the substrate and between the drain region and the source region,
- wherein the source region and the substrate-surface doped region are connected to a second electrode terminal, the gate structure is connected to the second electrode terminal or is different from a bias terminal of the second electrode terminal, and
- wherein the first conductivity type and the second conductivity type are opposite.

18. The ESD protection device as claimed in claim 17, wherein a doped concentration of the inserted doped region and a doped concentration of the substrate-surface doped region are equal or are unequal.

19. The ESD protection device as claimed in claim 17, wherein a doped concentration of the inserted doped region is higher than a doped concentration of the doped well.

20. The ESD protection device as claimed in claim 17, wherein a doped concentration of the drain region and a doped concentration of the source region are higher than a doped concentration of the inter doped region.

21. The ESD protection device as claimed in claim 17, wherein the gate structure is disposed on the substrate and corresponds to an isolation region between the inter doped region and the source region.

22. The ESD protection device as claimed in claim 17, wherein the inter doped region is a lightly doped region.

23. The ESD protection device as claimed in claim 17, further comprising a plurality of shallow trench isolation units in the substrate, the shallow trench isolation units isolating at least the drain region and the doped well.

* * * * *